United States Patent
Slaughter

(10) Patent No.: US 6,549,454 B1
(45) Date of Patent: Apr. 15, 2003

(54) TMR MATERIAL HAVING A SUBSTANTIALLY SMOOTH AND CONTINUOUS ULTRA-THIN MAGNETIC LAYER

(75) Inventor: Jon M. Slaughter, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 167 days.

(21) Appl. No.: 09/677,505

(22) Filed: Oct. 2, 2000

(51) Int. Cl.⁷ .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS 6,083,764 A * 7/2000 Chen ............................ 438/3
6,232,777 B1 * 5/2001 Sato ............................ 324/252
6,344,954 B1 * 2/2002 Redon et al. ............. 360/324.2

* cited by examiner

Primary Examiner—Son T. Dinh
(74) Attorney, Agent, or Firm—William H. Koch

(57) ABSTRACT

A TMR material (10) is provided having a substantially smooth and continuous ultra-thin magnetic layer. The TMR material is provided with a first tunnel barrier layer (46) is formed on a first magnetic layer (42) and a second magnetic layer (44) formed on the first tunnel barrier layer (46). The second magnetic layer (44) provides the substantially smooth and continuous ultra-thin magnetic layer as the second magnetic layer (44) has the substantially smooth and continuous layer across at least a portion of said first tunnel barrier layer (46) and a thickness not exceeding about 20 Å.

14 Claims, 2 Drawing Sheets

-PRIOR ART-

TMR MATERIAL HAVING A SUBSTANTIALLY SMOOTH AND CONTINUOUS ULTRA-THIN MAGNETIC LAYER

FIELD OF THE INVENTION

The present invention generally relates to a magnetic material, and more particularly to a tunneling magneto resistance (TMR) material.

BACKGROUND OF THE INVENTION

Magnetoelectronic, spin electronic or spintronic devices have drawn a great deal of attention in the field of magnetics. These devices, which include magnetic random access memory (MRAM), magnetic field sensors, read/write heads for disk drives, and other magnetic applications, use giant magneto resistance (GMR) and tunneling magneto resistance (TMR) effects predominantly caused by electron spin rather than electron charge.

One class of spintronic device is formed of a GMR material or a TMR material. The basic structure of these two materials includes two magnetic layers separated by a spacer layer. In a GMR material, the spacer layer is conductive, while in a TMR material, the spacer layer is insulating. FIG. 1 illustrates an enlarged cross-sectional view of a TMR material 20 according to the prior art.

The TMR material 20, which is also referred to as a Magnetic Tunnel Junction (MTJ), has a first magnetic layer 22 and second magnetic layer 24 separated by an insulating spacer layer 26, which is also referred to as a tunnel barrier layer. The first and second magnetic layers 22,24 can be single layers of magnetic materials such as nickel, iron, copper, cobalt or alloys thereof. The tunnel barrier layer 26 is typically aluminum oxide ($Al_2O_3$), but may include any number of insulators, such as aluminum nitride or oxides of nickel, iron, cobalt or alloys thereof.

Without intending to be bound by theory and with particular reference to the enlarged view 28 of the interface 31 between the tunnel barrier layer 26 and second magnetic layer 24, as adsorbate atoms 30 are deposited on the surface 32 of the tunnel barrier layer 26, several types of layer growth are possible, and even in the absence of mixing between the atoms 30 and the surface 32 at the interface 31, the layer growth of atoms 30 that forms on the surface 32 may not be a preferable thin film.

The growth mode of the atoms 30 on the surface 32 is determined by several factors including: the mobility of the atoms 30 on the surface 32, the surface energy of the surface 32, the surface energy of atoms 30, and the binding energy of the atoms 30 to the surface 32 at the interface 31. In a majority of physical vapor deposition processes, the atoms 30 have sufficient energy for significant mobility on the surface 32, moving numerous atomic spacings before coming to rest. In this medium to high mobility environment, the atoms 30 will naturally form a film morphology, which minimizes the total energy of the atoms 30 on the surface 32. Thus, when the surface energy of the atoms 30 is high compared to the energy of the surface 32, a configuration will be favored, which minimizes the surface area of the atoms 30 at the expense of exposing some area of the surface 32, resulting in the formation of three-dimensional islands 34 of atoms 30 on the surface 32 during the initial stages of film growth. Conversely, if the energy of the surface 32 is higher than the atoms 30, the growth of the atoms 30 in an atomic layer-by-layer fashion over the surface 32 is preferred since this quickly covers the surface 32 with atoms 33 that form a surface that has a lower energy.

Strong bonding of the atoms 30 to the surface 32 favors the growth of an atomic layer of atoms 30 by limiting the mobility of the atoms 30 and by decreasing the total system energy through maximization of the contact between the atoms 30 and the surface 32. During layer-by-layer growth, the atoms 30 nearly complete a first atomic layer of atoms 30 on the surface 32 before forming the second atomic layer of atoms 30 on atoms 30. Three-dimensional growth (i.e., island growth) occurs when the atoms 30 tend to grow additional atom 30 on atom 30 layers rather than completing the first atomic layer of atoms 30 on the surface 32.

A film is generally considered to be continuous when it has covered over about 80% of a surface. When the growth mode is a layer-by-layer growth, the film is more likely to become continuous much faster than for an island growth mode. For island growth, it may take the equivalent of ten or more atomic layers of deposition before the film becomes continuous or substantially continuous. Such films are generally considered to be discontinuous and are composed of disconnected islands before enough material is deposited to make islands large enough to connect and form a substantially continuous layer. Furthermore, once a continuous film is formed it will be rougher than a film that is grown in a layer-by-layer manner.

It is often desirable to form a smooth and substantially continuous film on a substrate that is less than about ten atomic layers (i.e., less than about 20 Å thick). Prior to the present invention, it was impossible to form a smooth and substantially continuous layer that was less than about 20 Å if the film of material forms by island growth or any growth mode that is similarly three-dimensional. Even though a film with substantial island growth may become continuous with ten atomic layers, it will be much rougher than a film grown in a layer-by-layer manner as some areas will be only one or two atomic layers thick while other areas will be well over 10 atomic layers thick. While this layer-by-layer formation provides proper operation of a TMR material, it is desirable to form a TMR material having a substantially smooth and continuous magnetic layer that is less than about 20 Å as significant benefits would be realized with such a TMR material structure.

For example, double MTJs would significantly benefit from a substantially smooth and continuous ultra-thin magnetic layer as resonant effects in a double MTJ would be tunable if a magnetic layer is available having a 1–3 atomic layer thickness. (See, Xiangdong Zhang, Bo-Zang Li, Gang Sun, & Fu-Cho Pu, Phys. Rev. B, vol. 56, p 5484 (1997), and S. Takahashi & S. Maekawa, Phys. Rev. Lett. vol. 80, p 1758 (1998) for theoretical predictions of resonant effects that give a higher MR, etc. which are hereby incorporated by reference). In addition, magnetic bi-layers (i.e., two magnetic materials forming the first or second magnetic layer) in a single or multiple tunnel junction would increase thermal endurance if composed of a substantially smooth and continuous ultra-thin diffusion tunnel barrier layer grown on another tunnel barrier layer and a soft magnetic layer combination such that switching characteristics would not be adversely affect during device operation. Furthermore, a specific crystallographic phase could be obtained with the selection of the two magnetic materials forming the magnetic bi-layer in order to obtain desired magnetic properties, including, but not limited to coercivity, anisotropy, and magneto resistive ratio considerations. As may be appreciated, there are many desirable applications and attributes for a TMR material having a substantially smooth and continuous uniform ultra-thin magnetic layer.

Accordingly, it is -desirable to have a TMR material that includes a substantially smooth and continuous uniform magnetic layer with a thickness that does not exceed about 20 Å, preferably does not exceed 15 Å, and more preferably does not exceed about 10 Å.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EXEMPLARY EMBODIMENT

The following detailed description of a preferred embodiment is merely exemplary in nature and is not intended to limit the invention or the application and uses of the invention. Furthermore, there is no intention to be bound by any theory presented in the preceding background of the invention or the following detailed description of a preferred exemplary embodiment.

Figure 2:
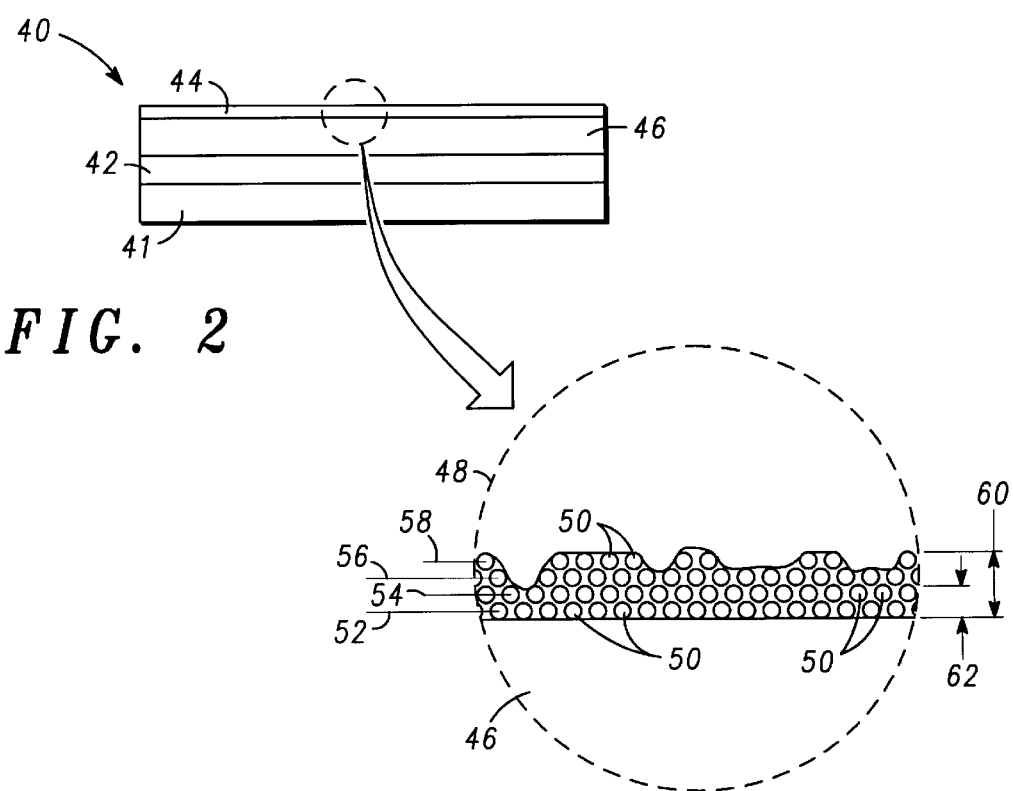
FIG. 2 is a enlarged cross-sectional of a TMR according to a preferred exemplary embodiment of the present invention.

FIG. 2 illustrates an enlarged cross-sectional view of a TMR material 40 according to a preferred embodiment of the present invention. The TMR 40 material, which is also referred to as a Magnetic Tunnel Junction (MTJ), has a first magnetic layer 42 formed on a substrate 41 and a second magnetic layer 44 formed on a tunnel barrier layer 46. The first and second magnetic layers (42,44), and additional magnetic layers subsequently discussed, can be single magnetic material layers, such as nickel, iron, copper, or cobalt or alloys thereof. Alternatively, the first and second magnetic layers (42,44), and the additional magnetic layers subsequently presented, can be composite magnetic layers, such as a layer of nickel-iron-cobalt covering a layer of cobalt-iron or three structures including layers of cobalt-iron and nickel-iron-cobalt and cobalt-iron with cobalt iron at the interface with the tunnel barrier layer 46. The tunnel barrier layer 46, and the other tunnel carrier layers to be subsequently discussed, is preferably aluminum oxide ($Al_2O_3$), but may include any number of insulators, such as aluminum nitride or oxides of nickel, iron, cobalt, Mg, Mn, Ta, Ti, Nb, Mo, W, Sr, Ce, La or alloys thereof, for example.

As can be seen in the enlarged view 48 of the interface between the tunnel barrier layer 46 and second magnetic layer 44, the adatoms 50 of the second magnetic layer 44 form a layer-by-layer structure on the tunnel barrier layer 46. The layer-by-layer structure has a first row of ad atoms 52 formed on a second row of ad atoms 54, a third row of ad atoms 56 formed on the second row 54, and a fourth row of ad atoms 58 formed on the third row 56. However, it should be understood that the layer-by-layer structure may be formed with any number of adatom rows, including but not limited to a single row and more than four rows. This layer-by-layer provides a second magnetic layer 44 on the tunnel barrier layer 46 having a maximum thickness 60 across at least a portion of the tunnel barrier layer 46 that is substantially smooth and continuous and does not exceed about 20 Å, preferably does not exceed about 15 Å, and more preferably does not exceed about 10 Å. More specifically, the maximum thickness 60 of the second magnetic layer 44 does not exceed the previously specified thickness and the second magnetic layer 44 provides a substantially continuous film on the tunnel barrier layer 46 that also improves the surface smoothness of the film on the tunnel barrier layer 46. One method of producing this generally uniform ultra-thin layer 44 on the tunnel barrier layer 46 is by increasing the binding strength at the surface of the tunnel barrier layer 46.

Previous efforts to make MTJs with ultra-thin layers have resulted in a discontinuous film rather than a continuous ultra-thin layer. (See, H. Kubota, T. Watabe, T. Miyazaki, J. Magnetism & Magnetic Materials, vol. 198–199, p. 173 (1999), and Y. Saito, K. Nakajima, K. Tanaka, and K. Inomata, IEEE Trans. Mag. vol 35, p. 2904 (1999), which are hereby incorporated by reference.) However, with the proper surface treatment, it is possible to make structures with a smooth continuous and ultra-thin layer. The surface treatment increases the bonding strength between the adsorbate metal layer (e.g., Co) and the insulator surface (e.g., $Al_2O_3$). For example, treating the surface of sapphire ($\alpha$-$Al_2O_3$), by attaching less than one molecular layer of hydroxyl groups to the surface, has been shown to change the growth mode of copper (Cu) from three-dimensional (island-like) to a more two-dimensional growth. (See, J. A. Kelber, Chengyu Niu, K. Shepherd, D.R. Jennison, and A. Bogicevic, Surface Science vol. 446, p. 76 (2000), which is hereby incorporated by reference). Similarly, surface modification can produce tunnel junction structures employing smooth and continuous ultra-thin layers of magnetic or nonmagnetic materials. The ideal agents for surface modification are those that are made of elements contained in other layers of the structure or elements that will float up to the surface of the adsorbate film during deposition, and thus be removed from the interface region. The best candidate agents depend upon the materials used in the junction but include: OH groups, oxygen and the other column VI elements, nitrogen and the other column V elements, halogens, and oxides of the magnetic elements.

Figure 3:
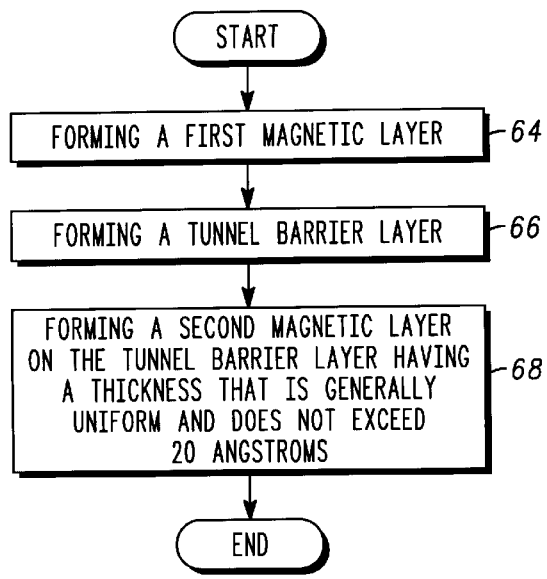
FIG. 3 is a flowchart illustrating the method for forming the TMR material of FIG. 2 according to a preferred embodiment of the present invention.

Referring to FIG. 3, the method is presented for forming a TMR material according to a preferred embodiment of the present invention. Initially, the method begins with the forming of a first magnetic layer 64. After the first magnetic layer is formed, the tunnel barrier layer is formed on the first magnetic layer 66. This may be accomplished using many different techniques. For example, if aluminum oxide is to form the tunnel barrier layer, aluminum may be initially deposited on the first magnetic layer and oxidized using known techniques.

Once the tunnel barrier layer is formed, the method proceeds by forming a second magnetic layer on the insulating layer having a thickness 68 that is substantially smooth and continuous and does not exceed about 20 Å, preferably 15 Å, and more preferably about 10 Å. The specific process of forming a second magnetic layer having at least these two characteristics is dependent upon the materials selected for the tunnel barrier layer and the second magnetic layer. However, the following general description provides the method that produces the desirable second magnetic material layer on the tunnel barrier layer. This process can be used with a wide variety of materials and with a substantial number of variations and alterations.

A negatively charged species is introduced to the surface of the tunnel barrier layer through such processes like exposure of the surface to molecules which disassociate on the surface and leave the negatively charged fragment, or through stimulating the disassociation on the surface using light or electron beams, exposure to plasma, or other means by which a negatively charged species may be introduced on to the surface of the tunnel barrier layer. This introduction of the negatively charged particles is followed by depositing the second magnetic layer on the tunnel barrier layer, producing the TMR material that may be used in any number of number of alternative embodiments, including multiple MTJs.

Figure 4:
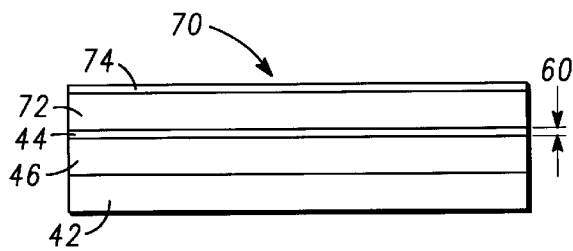
FIG. 4 is an enlarged cross-sectional view of the TMR according of FIG. 2 having a bi-layer second preferred exemplary embodiment of the present invention.

FIG. 4 illustrates a multiple MTJ in the form of a double MTJ 70 according to a preferred embodiment of the present invention. While, a double MTJ is presented as an exemplary preferred embodiment, it should be understood that multiple MTJs other than the double MTJ are within the scope and spirit of this invention, including but not limited to triple and quadruple MTJs, or any multiple of a single, double, triple and quadruple MTJ. The double MTJ 70 has the first magnetic layer 42, second magnetic layer 44, and tunnel barrier layer 46 as discussed and formed in conjunction with FIGS. 2 and 3. In addition, a second tunnel barrier layer 72 is formed on the second magnetic layer 44 and a third magnetic layer 74 is formed on the second tunnel barrier layer 72. This double MTJ 70 having the substantially smooth and continuous ultra-thin thickness 60 of the second magnetic layer 44 presents numerous advantages including, but not limited to a high magneto resistive ratio (MR) and tunable resonant effects, for example. While the substantially smooth and continuous ultra-thin thickness 60 provides many desirable characteristics in the multiple MTJs, the ultra-thin thickness 60 of the second magnetic layer may also be advantageously utilized as one component of a magnetic bi-layer in a TMR material.

Figure 5:
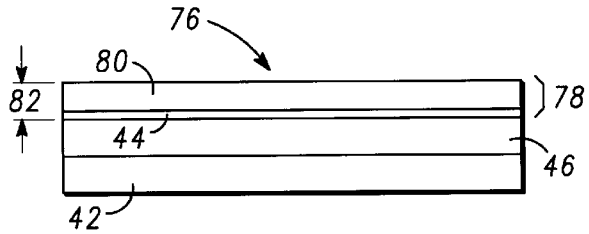
FIG. 5 is an enlarged cross-sectional view of a multiple MTJ according to a preferred exemplary embodiment of the present invention.

FIG. 5 shows a TMR material 76 having a magnetic bi-layer 78. This TMR material 76 includes the first magnetic layer 42 and tunnel barrier layer 46 discussed and formed in conjunction with FIGS. 2 and 3, and at least the second magnetic layer 44 has the substantially smooth and continuous ultra-thin thickness 60 that is generally uniform and does not exceed about 20 Å, preferably does not exceed about 15 Å, and more preferably does not exceed about 10 Å.

The TMR material 76 with the bi-layer 78 may be used to provide many desirable device characteristics. For example, an increased thermal endurance may be provided with the bi-layer 78 without substantially increasing the overall thickness of the top magnetic layer 82 and adversely affecting the switching characteristics of a device. In addition, a desired crystallographic phase or orientation may be obtained with the proper selection of the materials forming the bi-layer 78. Furthermore, the materials of the bi-layer 78 may be selected based upon MR considerations. More specifically, a material could be selected for the second magnetic layer 44 that provides a high MR even though this material has poor magnetic properties. The poor magnetic properties of the second magnetic layer 44 would be enhanced with the selection of the magnetic material of the third magnetic layer 80. These desirable device characteristics, and many other desirable device characteristics, are available with the bi-layer configuration of the TMR material 76 in numerous spintronic devices, including but not limited to memory arrays.

Figure 1:
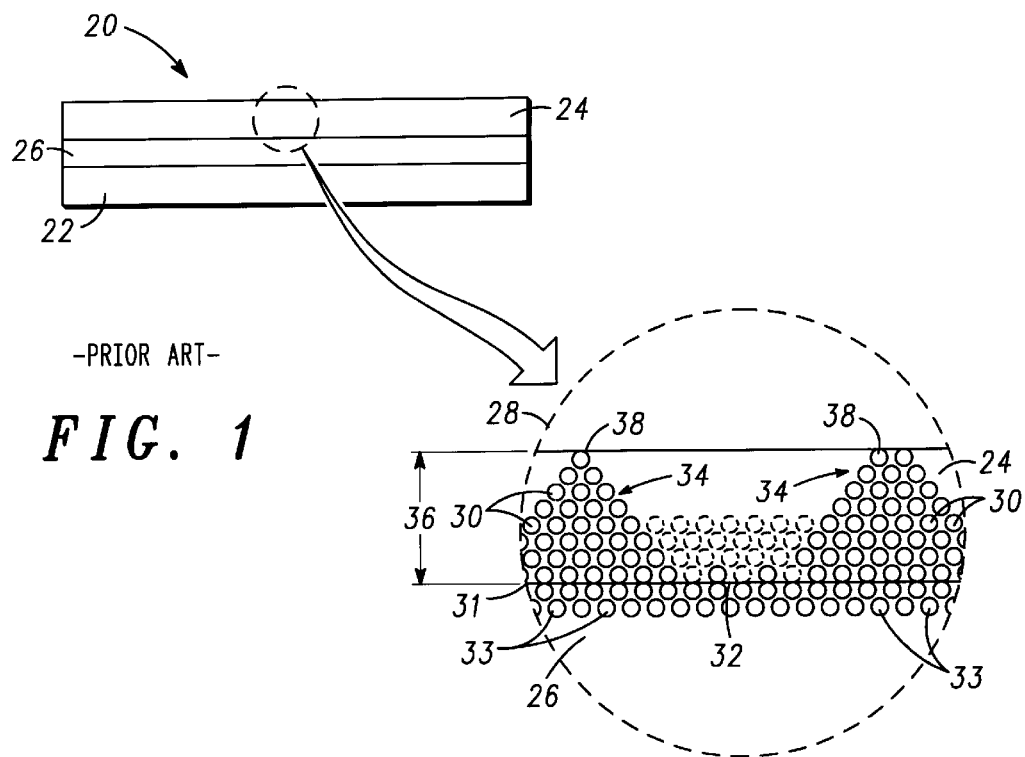
FIG. 1 is an enlarged cross-sectional view of a tunneling magneto resistance (TMR) material according to the prior art.
Figure 6:
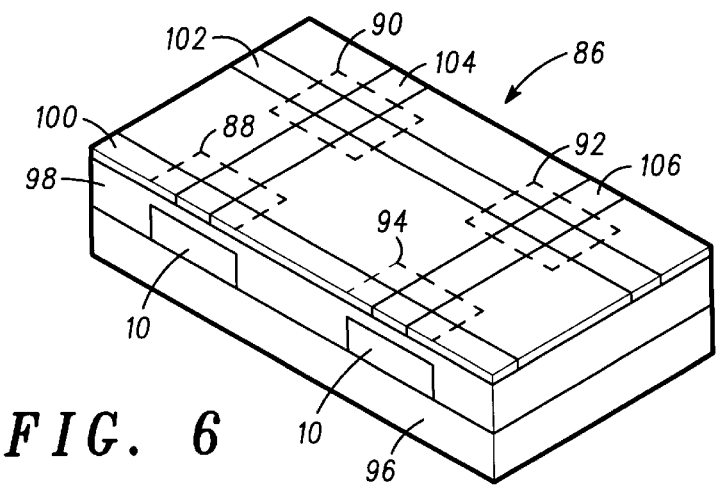
FIG. 6 is an enlarged perspective view of a portion of a memory utilizing the TMR material of FIG. 2 according to a preferred exemplary embodiment.

FIG. 6 illustrates an enlarged perspective view of a portion of a memory array or memory 86 that uses the TMR material 10 of FIG. 1 for at least one memory cell of the memory 86. The memory 86 includes a plurality of memory cells including a first cell 88, a second cell 90, a third cell 92, and a fourth cell 94, indicated by dashed boxes. The memory 86 also includes a substrate 96, for example a semiconductor substrate, onto which the TMR material 10 forms multiple elements representing the multiple cells (88,90,92,94). The substrate 96 can also include other circuitry including sense amplifiers and digital circuitry.

A dielectric 98 is applied to cover the exposed portions of the substrate 96 and each TMR material 10 that is formed on substrate 96. Typically, the cells (88,90,92,94) are formed on the substrate 96 with a space between each of the cells (88,90,92,94). A conductor is then applied to interconnect the TMR material 10 forming the cells (88,90,92,94) in individual rows. For example, a first conductor 100 is applied between the first cell 88 and the fourth cell 94 to form a first row or sense line, and a second conductor 102 is applied between second cell 90 and third cell 92 in order to form a second row or sense line. A plurality of transverse conductors or word lines are applied on the surface of dielectric 98 overlying the memory cells. A third conductor or first word line 104 overlays TMR material 10 of the first cell 88 and second cell 90, and a fourth conductor or second word line 106 overlays the TMR material 10 of the third cell 92 and fourth cell 94. This configuration provides the basic structure for a spintronic memory device. As may be appreciated, this should not be understood as the only configuration as numerous arrangements and devices are available with the TMR material 10.

From the foregoing description, it should be appreciated that a TMR material having a substantially smooth and continuous ultra-thin magnetic layer is provided that presents significant benefits that have been presented and also benefits that would be apparent to one skilled in the art. Furthermore, while multiple embodiments have been presented in the foregoing description, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

APPENDIX A

Bottom-pinned MTJ with Ultra-thin Free Layer

1. Deposit bottom contact layers, pinning structure and pinned ferromagnetic layer onto substrate;
2. Deposit aluminum layer on pinned layer;
3. Oxidize Al layer to form an aluminum oxide (AlOx) surface;

APPENDIX A-continued

4. Treat surface of AlOx;
5. Deposit less than 20 Å of ferromagnetic material on treated AlOx surface to form a smooth continuous ultra-thin layer; and
6. Deposit top contact layers.

Top-pinned MTJ with Ultra-thin Pinned Layer

1. Deposit bottom contact layers and free (unpinned) magnetic layer onto substrate;
2. Deposit aluminum layer on free layer;
3. Oxidize Al layer to form AlOx surface;
4. Treat surface treatment of AlOx;
5. Deposit less than 20 Å of ferromagnetic material on treated AlOx surface to form a smooth continuous ultra-thin layer;
6. Deposit pinning structure to magnetically pin the ultra-thin layer; and
7. Deposit top contact layers.

Bottom-pinned MTJ with Ultra-thin Interface Layer

1. Deposit bottom contact layers, pinning structure and pinned ferromagnetic layer onto substrate;
2. Deposit aluminum layer on pinned layer;
3. Oxidize Al layer to form AlOx surface;
4. Treat Surface of AlOx;
5. Deposit less than 20 Å of ferromagnetic material on treated AlOx surface to form a smooth continuous ultra-thin layer which will become the interface;
6. Deposit a layer of a second ferromagnetic material to complete the free layer composed of an ultra-thin interface layer and a second magnetic layer, the two layers acting as a single magnetic layer for switching or sensing; and
7. Deposit top contact layers.

Double MTJ with Ultra-thin Intermediate Layer And Two Pinned Layers

1. Deposit bottom contact layers, pinning structure and pinned ferromagnetic layer onto substrate;
2. Deposit first aluminum layer on pinned layer;
3. Oxidize Al layer to form AlOx surface;
4. Treat surface of AlOx;
5. Deposit less than 20 Å of ferromagnetic material on treated AlOx surface to form a smooth continuous ultra-thin layer;
6. Deposit second aluminum layer on ultra-thin layer;
7. Oxidize Al layer to form AlOx surface;
8. Optional surface treatment of AlOx;
9. Deposit third ferromagnetic material;
10. Deposit pinning structure to magnetically pin the third ferromagnetic layer; and
11. Deposit top contact layers.

Surface Treatment Examples for the Fourth Step In the Previously Provided Processes 1. Expose the surface to a dose of air, or nitrogen, containing water vapor, the dose being large enough to produce between 0.1 and 2 molecular layer of OH groups on the surface;
2. Expose the surface to a dose of oxygen plasma or nitrogen plasma, the dose being large enough to produce between 0.1 and 2 molecular layer of oxygen or nitrogen on the surface;
3. Expose the surface to a dose of elements found in columns V or VI of the periodic table, the dose being large enough to produce between 0.1 and 2 molecular layer of oxygen or nitrogen on the surface; and
4. Deposit between 0.1 and 2 atomic layers of Ni, Fe, Co, or Gd followed by exposure to oxygen and/or nitrogen gas, oxygen and/or nitrogen plasma, water vapor or water plasma.

What is claimed is:

1. A tunneling magneto resistance (TMR) material comprising:
   a first magnetic layer;
   a first tunnel barrier layer on said first magnetic layer; and
   a second magnetic layer having a substantially smooth and continuous layer across at least a portion of said tunnel barrier layer and a thickness not exceeding about 20 Å.

2. The TMR material of claim 1, wherein said substantially smooth and continuous uniform layer is across substantially the entire layer of said tunnel barrier layer.

3. The TMR material of claim 1, wherein said second magnetic layer includes a plurality of different thicknesses, said plurality of different thicknesses forming said substantially smooth and continuous layer across at least a portion of said tunnel barrier layer and each of said plurality of different thicknesses having said thickness not exceeding about 20 Å.

4. The TMR material of claim 1, further comprising a third magnetic layer on said second magnetic layer.

5. The TMR material of claim 4, wherein said third magnetic layer has a substantially smooth and continuous layer across at least a portion of said second magnetic layer and a thickness not exceeding about 20 Å.

6. The TMR material of claim 1, further comprising a second tunnel barrier layer on said first magnetic layer.

7. The TMR material of claim 5, further comprising a third magnetic layer on said second tunnel barrier.

8. The TMR material of claim 7, wherein said third magnetic layer has a substantially smooth and continuous uniform layer across at least a portion of said second tunnel layer and a thickness not exceeding about 20 Å.

9. The TMR material of claim 1, wherein said thickness of said second magnetic layer does not exceed about 15 Å.

10. The TMR material of claim 1, wherein said thickness of said second magnetic layer does not exceed about 10 Å.

11. A memory, comprising:
    a substrate; and
    a plurality of TMR materials on said substrate, said plurality of TMR materials including:
      a first magnetic layer;
      a first tunnel barrier layer on said first magnetic layer; and
      a second magnetic layer having a substantially smooth and continuous layer across at least a portion of said tunnel barrier layer and a thickness not exceeding about 20 Å.

12. The memory of claim 11, further comprising a dielectric at least covering a portion of said substrate and a portion of each of said plurality of TMR materials.

13. The memory of claim 12, further comprising a first conductor overlaying a first TMR material and a second TMR material of said plurality of TMR materials.

14. The memory of claim 13, further comprising a second conductor overlaying a third TMR material and a forth TMR material of said plurality of TMR materials.

* * * * *

UNITED STATES PATENT AND TRADEMARK OFFICE
CERTIFICATE OF CORRECTION

PATENT NO.    : 6,549,454 B1                                    Page 1 of 1
DATED         : April 15, 2003
INVENTOR(S)   : Slaughter It is certified that error appears in the above-identified patent and that said Letters Patent is hereby corrected as shown below:

<u>Column 1,</u>
Line 4, please add the following paragraph:
-- This invention was made with Government support under Agreement No. MDA972-96-3-0016 awarded by DARPA. The Government has certain rights in the invention. --

Signed and Sealed this

Twenty-eighth Day of October, 2003

JAMES E. ROGAN
*Director of the United States Patent and Trademark Office*